US012685210B2

(12) United States Patent
Ye et al.

(10) Patent No.: US 12,685,210 B2
(45) Date of Patent: Jul. 14, 2026

(54) MULTI-CHIP PACKAGING METHOD

(71) Applicant: Luxis Precision Intelligent Manufacturing (Kunshan) Co., Ltd., Kunshan City (CN)

(72) Inventors: Yijun Ye, Kunshan City (CN); Guoqing Yu, Kunshan City (CN); Jie Hao, Kunshan City (CN)

(73) Assignee: LUXIS PRECISION INTELLIGENT MANUFACTURING (KUNSHAN) CO., LTD., Kunshan City (CN)

( * ) Notice: Subject to any disclaimer, the term of this patent is extended or adjusted under 35 U.S.C. 154(b) by 490 days.

(21) Appl. No.: 18/196,530

(22) Filed: May 12, 2023

(65) Prior Publication Data

US 2024/0128141 A1     Apr. 18, 2024

(30) Foreign Application Priority Data

Oct. 14, 2022     (CN) ......................... 202211262174.6

(51) Int. Cl.
  H10W 74/10     (2026.01)
  H10W 72/00     (2026.01)
      (Continued)

(52) U.S. Cl.
  CPC ....... H10W 74/121 (2026.01); H10W 72/012 (2026.01); H10W 72/071 (2026.01);
      (Continued)

(58) Field of Classification Search
  CPC ... H01L 23/3135; H01L 21/565; H01L 24/17; H01L 25/0652; H01L 25/0657;
      (Continued)

(56) References Cited

U.S. PATENT DOCUMENTS 8,039,303 B2 * 10/2011 Shim ................... H01L 23/5389
                                      257/E23.012
9,142,428 B2 * 9/2015 Lin ...................... H10W 20/023
      (Continued)

FOREIGN PATENT DOCUMENTS

CN      101996895 A  *  3/2011  .......... H10W 42/284
CN      106847710 A     6/2017
      (Continued)

OTHER PUBLICATIONS

Chinese Office Action and Search Report for Chinese Application No. 202211262174.6, dated Aug. 22, 2024, with English translation.
      (Continued)

*Primary Examiner* — Sue A Purvis
(74) *Attorney, Agent, or Firm* — Birch, Stewart, Kolasch & Birch, LLP

(57)          ABSTRACT

A multi-chip packaging method includes: flip-mounting a first chip on a substrate on which first metal posts are arranged; mold packaging the first metal posts and the first chip to obtain a first package; forming a first redistribution layer on the surface of the first package; flip-mounting a second chip on a surface of the first redistribution layer and mold packaging the second chip to obtain a second package; removing the substrate and forming a second redistribution layer on a surface of the first package; forming second metal posts spaced apart from each other and flip-mounting a third chip on a surface of the second redistribution layer, and mold packaging the third chip and the second metal posts to obtain a third package; forming solder balls on a surface of the third package, where the solder balls are electrically connected to the second redistribution layer through the second metal posts.

6 Claims, 9 Drawing Sheets

(51) Int. Cl.

| | |
|---|---|
| *H10W 72/20* | (2026.01) |
| *H10W 74/01* | (2026.01) |
| *H10W 90/00* | (2026.01) |

(52) U.S. Cl.
CPC ....... *H10W 74/016* (2026.01); *H10W 74/129* (2026.01); *H10W 90/701* (2026.01); *H10W 72/07204* (2026.01); *H10W 72/07252* (2026.01); *H10W 72/227* (2026.01); *H10W 74/142* (2026.01)

(58) Field of Classification Search
CPC ... H01L 25/071; H01L 24/82; H01L 21/6835; H01L 23/5389
See application file for complete search history.

(56) References Cited

U.S. PATENT DOCUMENTS

| | | | | |
|---|---|---|---|---|
| 9,576,919 | B2 * | 2/2017 | Scanlan | ................. H10P 54/00 |
| 10,593,620 | B2 * | 3/2020 | Agarwal | .............. H10W 20/42 |
| 10,903,168 | B2 * | 1/2021 | Bhagavat | ............. H10W 70/65 |
| 2009/0206461 | A1 * | 8/2009 | Yoon | ................... H10W 74/117 |
| | | | | 257/737 |
| 2015/0303174 | A1 * | 10/2015 | Yu | ........................ H01L 21/565 |
| | | | | 438/109 |
| 2017/0053898 | A1 * | 2/2017 | Yeh | ....................... H10W 90/00 |
| 2017/0317053 | A1 * | 11/2017 | Hung | ................. H01L 25/0652 |

| | | | | |
|---|---|---|---|---|
| 2019/0006309 | A1 * | 1/2019 | Jeng | ..................... H01L 21/568 |
| 2019/0333893 | A1 | 10/2019 | Yu et al. | |
| 2020/0043892 | A1 | 2/2020 | Wu et al. | |
| 2021/0391314 | A1 | 12/2021 | Jeng et al. | |
| 2021/0398892 | A1 | 12/2021 | Qiaoming et al. | |
| 2022/0084925 | A1 | 3/2022 | Chen et al. | |
| 2022/0271018 | A1 | 8/2022 | Chen et al. | |
| 2024/0063178 | A1 * | 2/2024 | Yao | ........................ H01L 24/80 |

FOREIGN PATENT DOCUMENTS

| | | | | |
|---|---|---|---|---|
| CN | 108109949 | A | 6/2018 | |
| CN | 109216203 | A | 1/2019 | |
| CN | 110400780 | A | 11/2019 | |
| CN | 110634832 | A | 12/2019 | |
| CN | 111354652 | A | 6/2020 | |
| CN | 112038330 | A | 12/2020 | |
| CN | 212625575 | U | 2/2021 | |
| CN | 112864147 | A | 5/2021 | |
| CN | 113192904 | A | 7/2021 | |
| CN | 114267667 | A | 4/2022 | |
| CN | 114975409 | A | 8/2022 | |
| KR | 20110008831 | A * | 1/2011 | ........... H10W 90/00 |
| TW | 201906103 | A | 2/2019 | |

OTHER PUBLICATIONS

Chinese Search Report for Chinese Application No. 2022112621746, dated Oct. 29, 2024, with English translation.

* cited by examiner

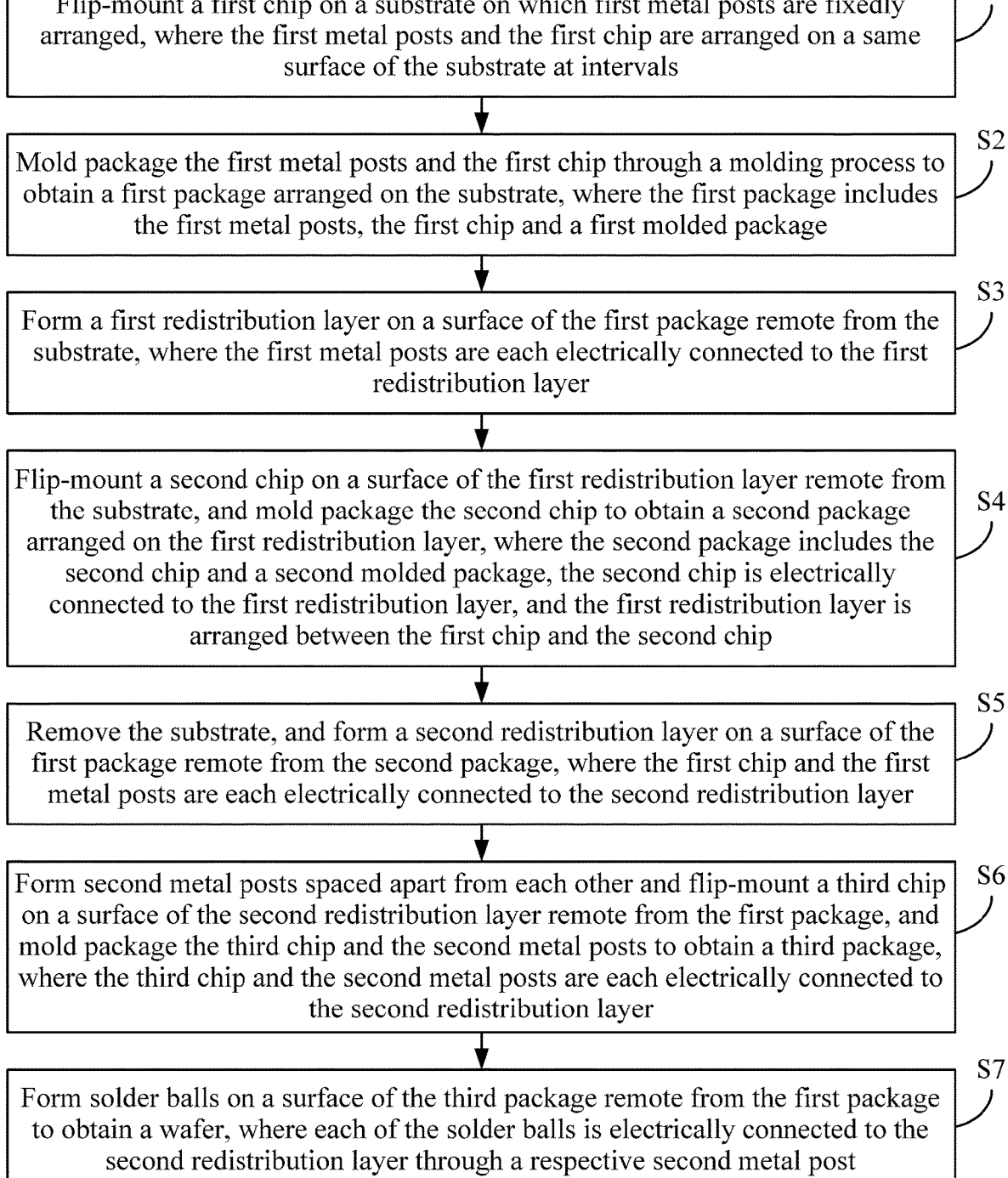

Flip-mount a first chip on a substrate on which first metal posts are fixedly arranged, where the first metal posts and the first chip are arranged on a same surface of the substrate at intervals

S1

Mold package the first metal posts and the first chip through a molding process to obtain a first package arranged on the substrate, where the first package includes the first metal posts, the first chip and a first molded package

S2

Form a first redistribution layer on a surface of the first package remote from the substrate, where the first metal posts are each electrically connected to the first redistribution layer

S3

Flip-mount a second chip on a surface of the first redistribution layer remote from the substrate, and mold package the second chip to obtain a second package arranged on the first redistribution layer, where the second package includes the second chip and a second molded package, the second chip is electrically connected to the first redistribution layer, and the first redistribution layer is arranged between the first chip and the second chip

S4

Remove the substrate, and form a second redistribution layer on a surface of the first package remote from the second package, where the first chip and the first metal posts are each electrically connected to the second redistribution layer

S5

Form second metal posts spaced apart from each other and flip-mount a third chip on a surface of the second redistribution layer remote from the first package, and mold package the third chip and the second metal posts to obtain a third package, where the third chip and the second metal posts are each electrically connected to the second redistribution layer

S6

Form solder balls on a surface of the third package remote from the first package to obtain a wafer, where each of the solder balls is electrically connected to the second redistribution layer through a respective second metal post

MULTI-CHIP PACKAGING METHOD

CROSS-REFERENCE TO RELATED APPLICATION(S)

This application claims priority to Chinese Patent Application No. 202211262174.6 filed Oct. 14, 2022, the disclosure of which is incorporated herein by reference in its entirety.

TECHNICAL FIELD

This invention relates to the field of chip packaging technologies, and more particularly, to a multi-chip packaging method.

BACKGROUND

Currently, the Internet of Things, big data, cloud computing, and the like require that a degree of integration of electronic packaging is higher and higher, electrical connections between chips and between a chip and a substrate are shorter and shorter, and heat dissipation performance of a three-dimensional package of multiple chips is better.

In view of the large gap of the chip packaging technology, the substrate technology with respect to the chip manufacturing technology in technology, it is generally recognized in the industry that the time of promoting the chip packaging technology as the leading direction, to thereby improving the performance-to-price ratios of electronic products has come, and the SiP (system in package) will be one of the necessary ways to go beyond Moore's Law. The SiP technology is to electrical signaling connect a chip and a passive element to form a product having a subsystem function by mixing various technologies such as the conventional packaging technology, the advanced packaging technology, the substrate technology, the surface mount technology, and the like. Wafer level packaging (WLP), as an advanced packaging technology indispensable to SiP technology, has developed rapidly since 2000.

In the conventional technology, through silicon via (TSV)-based Si interposer technology and TSV-based three-dimensional packaging techniques are considered as ideal options for high integratedly packaging multiple chips. The silicon interposer technology makes it possible to use the TSV-based Si interposer for the connection between adjacent chips. However, since the manufacturing technology of the TSV is extremely difficult, for example, the formation of the copper posts by electroplating is prone to generating flying scraps, the expense is high and the cost is high.

SUMMARY

The present invention provides a multi-chip packaging method, which makes the multi-chip packaging structure is-less difficult to manufacture with a lower cost.

The technical solution employed in the present invention is as follows.

A multi-chip packaging method, includes steps of:

S1, flip-mounting a first chip on a substrate on which first metal posts are fixedly arranged, where the first metal posts and the first chip are arranged on a same surface of the substrate at intervals;

S2, mold packaging the first metal posts and the first chip through a molding process to obtain a first package arranged on the substrate, where the first package includes the first metal posts, the first chip and a first molded package;

S3, forming a first redistribution layer on a surface of the first package remote from the substrate, where the first metal posts are each electrically connected to the first redistribution layer;

S4, flip-mounting a second chip on a surface of the first redistribution layer remote from the substrate, and mold packaging the second chip to obtain a second package arranged on the first redistribution layer, where the second package includes the second chip and a second molded package, the second chip is electrically connected to the first redistribution layer, and the first redistribution layer is arranged between the first chip and the second chip;

S5, removing the substrate, and forming a second redistribution layer on a surface of the first package remote from the second package, where the first chip and the first metal posts are each electrically connected to the second redistribution layer;

S6, forming second metal posts spaced apart from each other and flip-mounting a third chip on a surface of the second redistribution layer remote from the first package, and mold packaging the third chip and the second metal posts to obtain a third package, where the third chip and the second metal posts are each electrically connected to the second redistribution layer; and S7, forming solder balls on a surface of the third package remote from the first package to obtain a wafer, where each of the solder balls is electrically connected to the second redistribution layer through the respective second metal post.

Optionally, the first package further includes a passive element group, and the multi-chip packaging method further includes, before the step S2, mounting the passive element group to the substrate, and in the step S2, mold packaging the first metal posts, the first chip and the passive element group through the molding process.

Optionally, the step S2 includes:

S21, mold packaging the first metal posts and the first chip through a molding process to obtain a first temporary molded package; and S22, grinding the first temporary molded package to expose a back surface of the first chip and the first metal posts, and obtaining the first package.

Optionally, the step S6 includes:

S61, forming second metal posts on a surface of the second redistribution layer remote from the first package by electroplating, where the second metal posts are electrically connected to the second redistribution layer;

S62, flip-mounting the third chip on a surface of the second redistribution layer remote from the first package, where the third chip is electrically connected to the second redistribution layer;

S63, mold packaging the second metal posts and the third chip through a molding process to obtain a second temporary molded package; and S64, grinding the second temporary molded package to expose a back surface of the third chip and the second metal posts to obtain a third package.

Optionally, the step S7 includes:

S71, forming an under-ball pad layer on the surface of the third package remote from the first package by a photolithographic process; and S72, forming solder balls by electroplating or ball plant-
ing on the under-ball pad layer.

Optionally, after the step S7, the multi-chip packaging
method further includes steps of:

S8, dividing the wafer into multiple monomers by cutting;
and

S9, soldering the solder balls of the monomers to an
interposer to obtain a multi-chip package.

A multi-chip packaging structure, includes a second pack-
age, a first redistribution layer, a first package, a second
redistribution layer, and a third package, which are sequen-
tially arranged from top to bottom.

The first package includes first metal posts, a first chip,
and a first molded package, two ends of each of the first
metal posts are electrically connected to the first redistribu-
tion layer and the second redistribution layer, respectively;

the second package includes a second chip and a second
molded package, and the second chip is electrically
connected to the first redistribution layer; and the third package includes second metal posts and a third
chip, one end of each of the second metal posts is
electrically connected to the second redistribution
layer, the first chip and the third chip are each electri-
cally connected to the second redistribution layer, elec-
trical signals of the first chip, the second chip, and the
third chip are respectively transmitted out through the
second metal posts.

Optionally, the first package further includes multiple
passive element groups, each of the passive element groups
includes at least one passive element, and the passive
element is a capacitance, a resistance or an inductance.

Optionally, the multi-chip packaging structure further
includes multiple under-ball pads and multiple solder balls,
where the multiple under-ball pads are in one-to-one corre-
spondence to the multiple solder balls, multiple second
metal posts are provided, the multiple under-ball pads are in
one-to-one correspondence with the multiple second metal
posts, each of the under-ball pads is electrically connected to
another end of a corresponding second metal post, and each
of the solder balls is soldered to a corresponding under-ball
pad.

Optionally, the multi-chip packaging structure further
includes an interposer, where the interposer includes an
interposer board and multiple interposer bumps, the multiple
solder balls are each soldered to an upper surface of the
interposer board, the multiple interposer bumps are fixedly
arranged on a lower surface of the interposer board, and the
number of the interposer bumps is larger than the number of
the solder balls.

According to the multi-chip packaging method and the
multi-chip packaging structure of the present invention,
electrical signals of the first chip are transmitted to the solder
balls through the second redistribution layer and the second
metal posts, electrical signals of the second chip are trans-
mitted to the solder balls through the first redistribution
layer, the first metal posts, the second redistribution layer
and the second metal posts, electrical signals of the third
chip are transmitted to the solder balls through the second
redistribution layer and the second metal posts, and a
short-distance electrical signal connection between the chips
and the transmission out of the electrical signals of the chips
are realized through the first redistribution layer and the
second redistribution layer, so that a manufacturing process
of the TSV is not required, thereby, the manufacturing
difficulty and costs are low.

BRIEF DESCRIPTION OF DRAWINGS

FIG. 1 is a flowchart of a multi-chip packaging method
according to an embodiment of the present invention;

REFERENCE NUMERALS IN THE DRAWINGS

Figure 2:
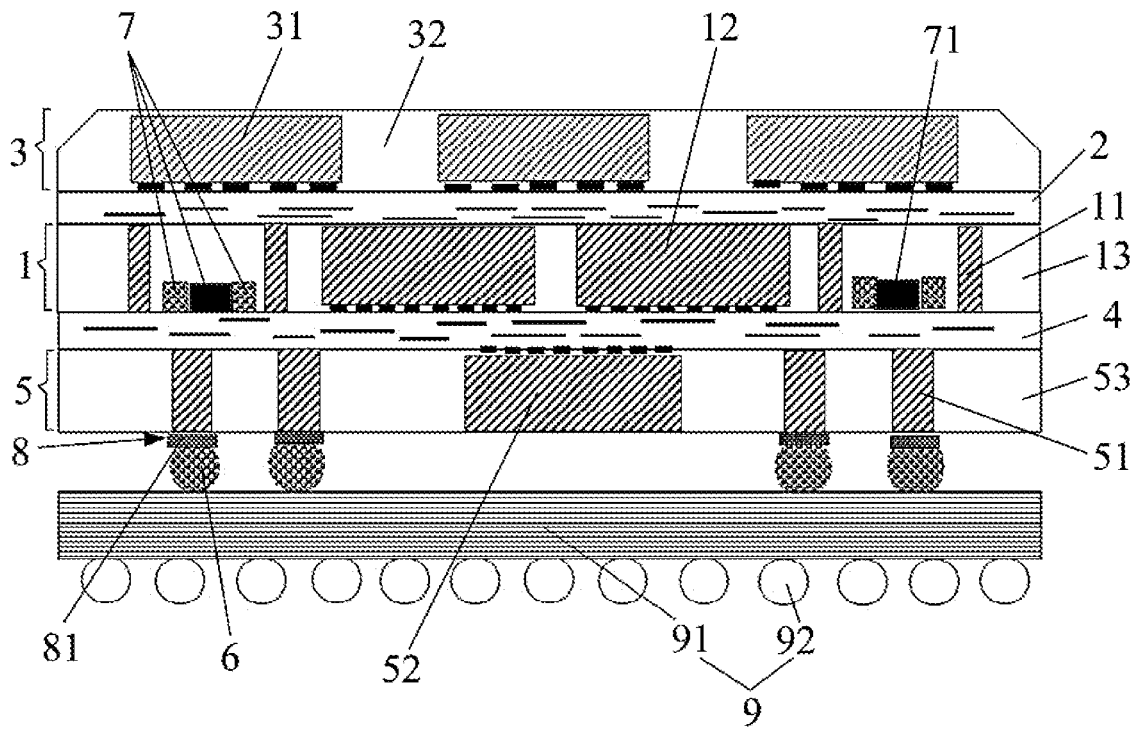
FIG. 2 is a schematic view showing a multi-chip pack-
aging structure according to an embodiment of the present
invention.

| Reference numerals in the drawings: | |
| --- | --- |
| 1. first package; | 11. first metal post; |
| 12. first chip; | 13. first molded package; |
| 2. first redistribution layer; | 3. second package; |
| 31. second chip; | 32. second molded package; |
| 4. second redistribution layer; | 5. third package; |
| 51. second metal post; | 52. third chip; |

-continued

| Reference numerals in the drawings: | |
|---|---|
| 53. third molded package; | 6. solder ball; |
| 7. passive element group; | 71. passive element; |
| 8. under-ball pad layer; | 81. under-ball pad; |
| 9. interposer; | 91. interposer board; |
| 92. interposer bump; | 100. substrate; |
| 200. first temporary molded package; | 300. second temporary molded package. |

DETAILED DESCRIPTION

In order that the technical issues to be addressed, the technical solutions adopted, and the technical effects achieved by the present invention may be made clearer, the technical solutions of the present invention are further described with reference to the drawings and the embodiments. It is to be understood that the embodiments described herein are merely illustrative of the invention rather than limiting the invention. It is also to be noted that, for ease of description, only part rather than all of the structures in connection with the present invention are shown in the drawings.

In the description of the present invention, unless otherwise expressly specified and limited, the terms "connected to each other", "connected", or "fixed" are to be construed in a broad sense, for example, as permanently connected, detachably connected, or integrated; mechanically connected or electrically connected; directly connected to each other or indirectly connected to each other via an intermediary; or internally connection of two components or interaction between two components. For those of ordinary skill in the art, specific meanings of the preceding terms in the present invention may be construed based on specific situations.

In the present invention, unless otherwise expressly specified and limited, when a first feature is described as "above" or "below" a second feature, the first feature and the second feature may be in direct contact, or be in contact via another feature between the two features. Moreover, when the first feature is described as "on", "above" or "over" the second feature, the first feature is right on, above or over the second feature or the first feature is obliquely on, above or over the second feature, or the first feature is simply at a higher level than the second feature. When the first feature is described as "under", "below" or "underneath" the second feature, the first feature is right under, below or underneath the second feature or the first feature is obliquely under, below or underneath the second feature, or the first feature is simply at a lower level than the second feature.

In the description of this embodiment, the orientational or positional relationships indicated by terms "above", "below", "right" and the like are based on the orientational or positional relationships shown in the drawings, merely for ease of description and simplifying operation, rather than indicating or implying that the referred device or element must have a specific orientation and is constructed and operated in a specific orientation, and thus they are not to be construed as limiting the present invention. In addition, the terms "first" and "second" are used only to distinguish between descriptions and have no special meaning.

First Embodiment

It is provided according to this embodiment a multi-chip packaging method, for manufacturing a multi-chip packaging structure which is less difficult in manufacturing and has a low cost. A multi-chip packaging structure is as shown in FIG. 2, and the structure may further be referred to as a silicon-based SIP.

As shown in FIG. 1, the multi-chip packaging method includes the following steps: S1, S2, S3, S4, S5, S6 and S7.

In the step S1, a first chip 12 is flip-mounted on a substrate 100 on which first metal posts 11 are fixedly arranged, and the first metal posts 11 and the first chip 12 are arranged on the same surface of the substrate 100 at intervals.

In this embodiment, the substrate 100 may be a glass, a sapphire wafer, or the like. Before the step S1 is performed, the substrate 100 may be pre-treated, for example, by polishing, rust removal, or the like. The first chip 12 is a chip having a bump, and the flip-mounting the first chip 12 on the substrate 100 means that the bump of the first chip 12 is mounted towards the substrate 100. In this embodiment, a surface of the first chip 12 having the bump is referred to as a front surface, and a surface opposite the front surface is referred to as a back surface.

Figure 3:
FIG. 3 is a schematic view showing a structure after first
metal posts are formed according to an embodiment of the
present invention.
Figure 4:
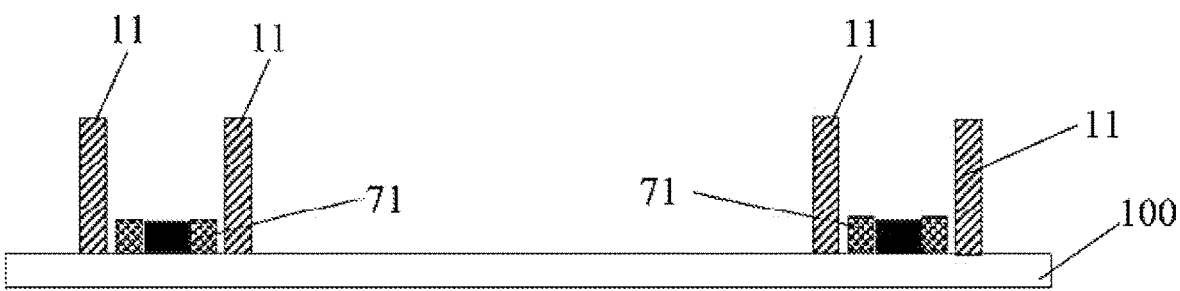
FIG. 4 is a schematic view showing a structure after
passive element groups are formed according to an embodi-
ment of the present invention.

Prior to the step S1, the first metal posts 11 may be formed on the substrate 100, in some embodiments, the first metal posts 11 may be obtained by using magnetron sputtering, photolithography, and plating techniques. For example, a metal layer is sputtered on a whole piece of glass or sapphire wafer (i.e., the substrate 100), a photoresist is spun on the surface of the substrate 100, exposure and development are performed, a pattern on a mask plate is transferred to the substrate 100, and electroplating is performed on the substrate 100 by utilizing a soft mask characteristic of the photoresist to obtain desired first metal posts 11. In this embodiment, multiple first metal posts 11 are provided, and the multiple first metal posts 11 are arranged at intervals. FIG. 3 is a schematic view showing that first metal posts 11 are arranged on the substrate 100. As shown in FIG. 3, there are two groups of first metal posts 11, two first metal posts 11 in each group of first metal posts 11 are relatively closer to each other. In this embodiment, after the step S1 is performed, the height of each of the first metal posts 11 is greater than the thickness of the first chip 12, and the first metal posts 11 are made of copper, gold, or the like. It should be noted that, as shown in FIG. 4, the first metal posts 11 and the first chip 12 are arranged to be spaced apart on the same surface of the substrate 100.

Optionally, prior to the step S1, the multi-chip packaging method further includes mounting a passive element group 7 to the substrate 100, where multiple passive element groups 7 are provided, each of the passive element groups 7 includes multiple passive elements 71, and the multiple passive elements 71 are mounted to the substrate 100 in sequence. In this embodiment, each of the passive element groups 7 is located between two adjacent first metal posts 11 which are closer to each other. The passive elements 71 are exemplified by a capacitor, a resistor, an inductor, and the like, which is not limited in this embodiment. The structure formed after the passive element groups 7 are mounted is as shown in FIG. 4.

Figure 5:
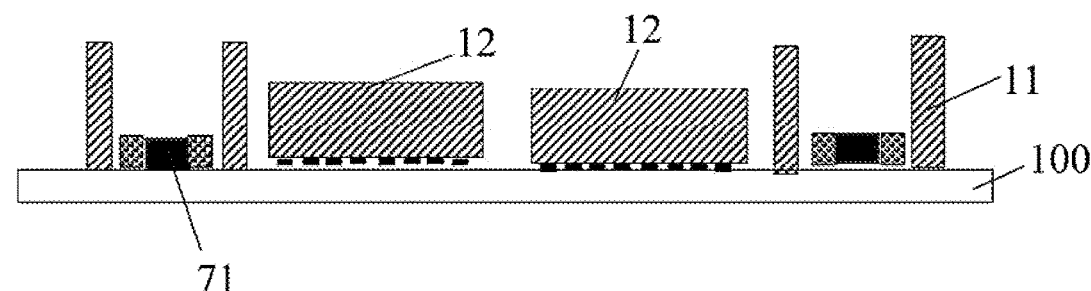
FIG. 5 is a schematic view showing a structure after first
chips are formed according to an embodiment of the present
invention.

After the passive element groups 7 are mounted, the first chip 12 is flip-mounted on the substrate 100 to form a structure as shown in FIG. 5.

In the step S2, the first metal posts 11 and the first chip 12 are mold packaged through a molding process to obtain a first package 1 arranged on the substrate 100. The first package 1 includes the first metal posts 11, the first chip 12, and a first molded package 13.

In the step S2, the first chip 12 and the first metal posts 11 are embedded in a mold compound for mold packaging to form the first molded package 13, and the first chip 12 and the first metal posts 11 are embedded in the first molded package 13. Reference may be made to the conventional technology for the basic principles and project of the molding process.

Optionally, the step S2 includes steps S21 and S22 as follows.

In the step S21, the first metal posts 11 and the first chip 12 are mold packaged through a molding process to obtain a first temporarily molded package 200.

Figure 6:
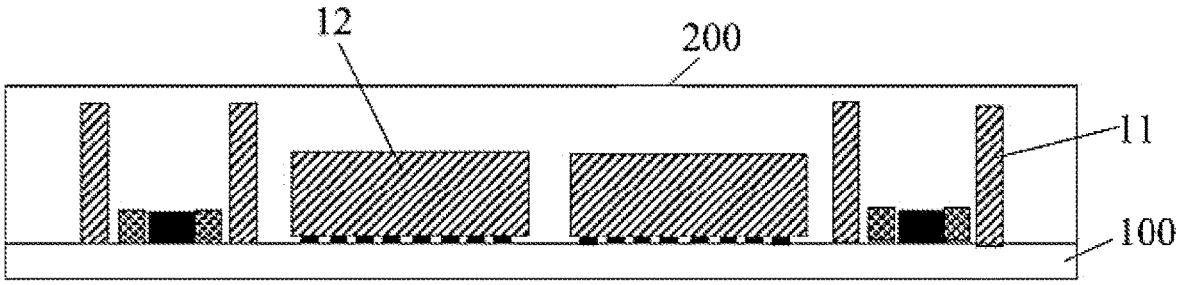
FIG. 6 is a schematic view showing a structure after a first
temporary molded package is formed according to an
embodiment of the present invention.

The first temporary molded package 200 is as shown in FIG. 6, it can be seen that the thickness of the colloid for wrapping the first metal posts 11 and the first chip 12 is larger than the thickness of each of the first metal posts 11 and the thickness of the first chip 12. In this case, the first metal posts 11 and the first chip 12 are completely embedded in the colloid.

In the S22, the first temporary molded package 200 is ground to expose a back surface of the first chip 12 and the first metal posts 11, and the first package 1 is obtained.

Figure 7:
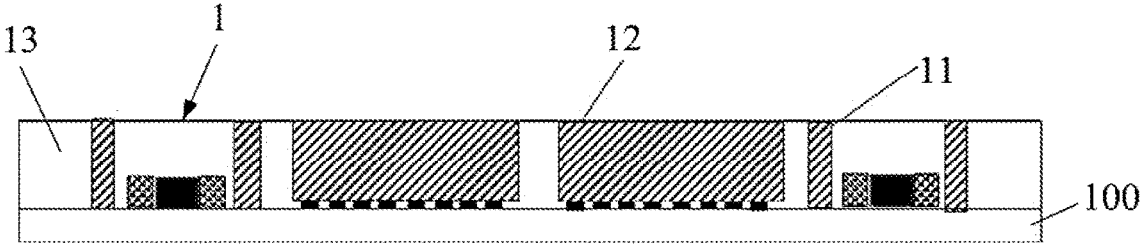
FIG. 7 is a schematic view showing a structure after a first
package is formed according to an embodiment of the
present invention.

After the first temporary molded package 200 is obtained, the first temporary molded package 200 may be thinned by a mechanical grinding device, a back surface of the first chip 12 and the first metal posts 11 are exposed, to facilitate the electrical connection of the first metal posts 11 to other circuits. After the step S22 is performed, as shown in FIG. 7, the height of each of the first metal posts 11 is equal to the thickness of the first chip 12. With the step S22, the obtained multi-chip packaging structure can be made thinner.

Optionally, after the first temporary molded package 200 is ground, a polishing process may be performed to obtain a first package 1 having a smooth surface.

In this embodiment, when the multi-chip packaging structure includes the passive element groups 7, in the step S2, the first metal posts 11, the first chip 12, and the passive element groups 7 are mold packaged through the molding process, and the first package 1 including the passive element groups 7 is formed.

In the step S3, a first redistribution layer 2 is formed on a surface of the first package 1 remote from the substrate 100, and the first metal posts 11 are each electrically connected to the first redistribution layer 2.

Figure 8:
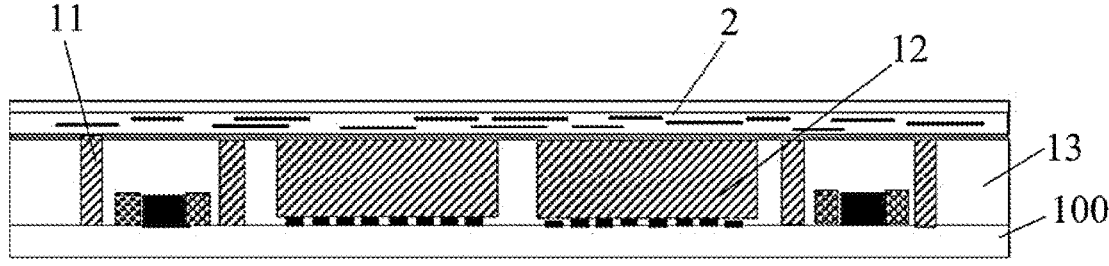
FIG. 8 is a schematic view showing a structure after a first
redistribution layer is formed according to an embodiment
of the present invention.

After the first package 1 is obtained, the first redistribution layer 2 is manufactured on the first package 1 to obtain a structure as shown in FIG. 8. The ends of the first metal posts 11 remote from the substrate 100 are each in contact with and electrically connected to the first redistribution layer 2. In the step S3, the first redistribution layer 2 may be formed by a photolithography process, that is, a photoresist is spin-coated on the first package 1, exposure is performed, and development is performed, the patterning on the mask plate is transferred to the first package 1, and by using a soft mask characteristic of the photoresist, electroplating is performed on the first package 1 to obtain the required first redistribution layer 2. For details, reference may be made to the conventional technology.

In the step S4, a second chip 31 is flip-mounted on a surface of the first redistribution layer 2 remote from the substrate 100, and the second chip 31 is mold packaged to obtain a second package 3 arranged on the first redistribution layer 2. The second package 3 includes a second chip 31 and a second molded package 32, the second chip 31 is electrically connected to the first redistribution layer 2, and the first redistribution layer 2 is interposed between the first chip 12 and the second chip 31.

Figure 9:
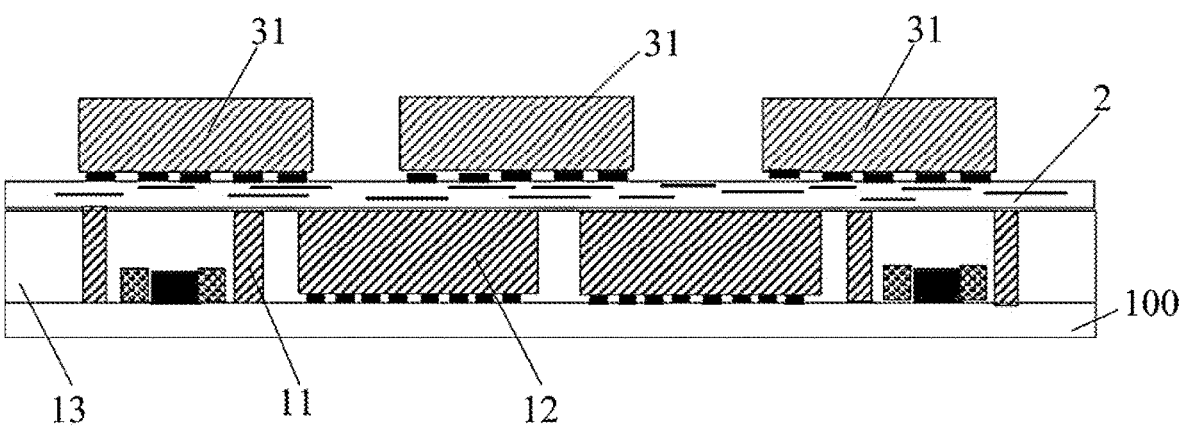
FIG. 9 is a schematic view showing a structure after
second chips are formed according to an embodiment of the
present invention.
Figure 10:
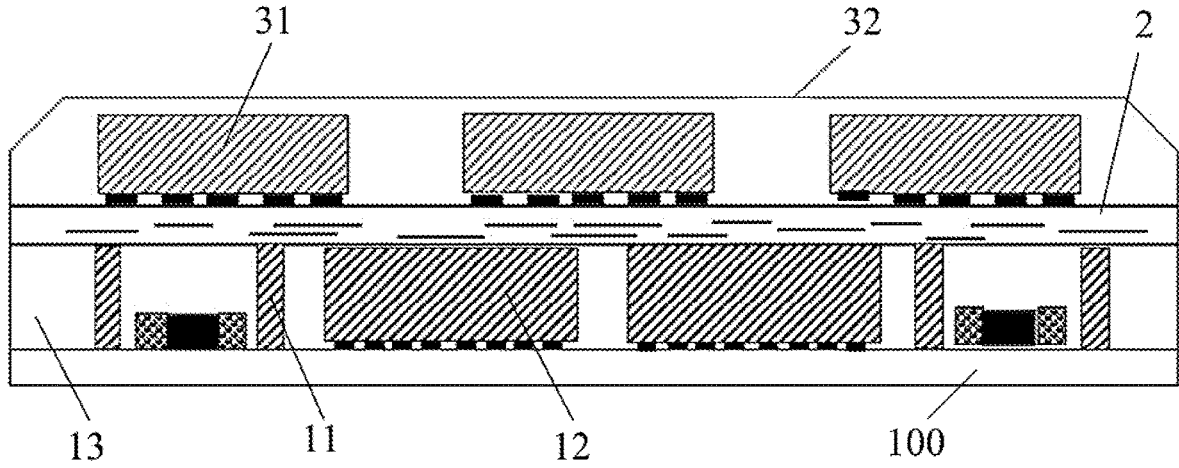
FIG. 10 is a schematic view showing a structure after a
second molded package is formed according to an embodi-
ment of the present invention.

In the step S4, the second chip 31 is flip-mounted on the first redistribution layer 2, that is, as shown in FIG. 9, the second chip 31 has a bump, and the face of the second chip 31 having the bump is disposed toward the first redistribution layer 2, so that the second chip 31 is electrically connected to the first redistribution layer 2 through the bump of the second chip 31. In this embodiment, multiple second chips 31 are provided, and the multiple second chips 31 are flip-mounted on the first redistribution layer 2 to form an electrical signal connection. After the multiple second chips 31 are mounted, the multiple second chips 31 are mold packaged by using the molding process to form a structure as shown in FIG. 10, where the multiple second chips 31 are respectively embedded in the second molded package 32. The thickness of the second molded package 32 is larger than the thickness of each of the second chips 31, so that the second chips 31 can be effectively protected. However, the thickness of the second molded package 32 is slightly larger than the thickness of each of the second chips 31, to avoid the thickness of the second package 3 from being large.

In the step S5, the substrate 100 is removed, and a second redistribution layer 4 is formed on the surface of the first package 1 remote from the second package 3, and the first chip 12 and the first metal posts 11 are each electrically connected to the second redistribution layer 4.

Figure 11:
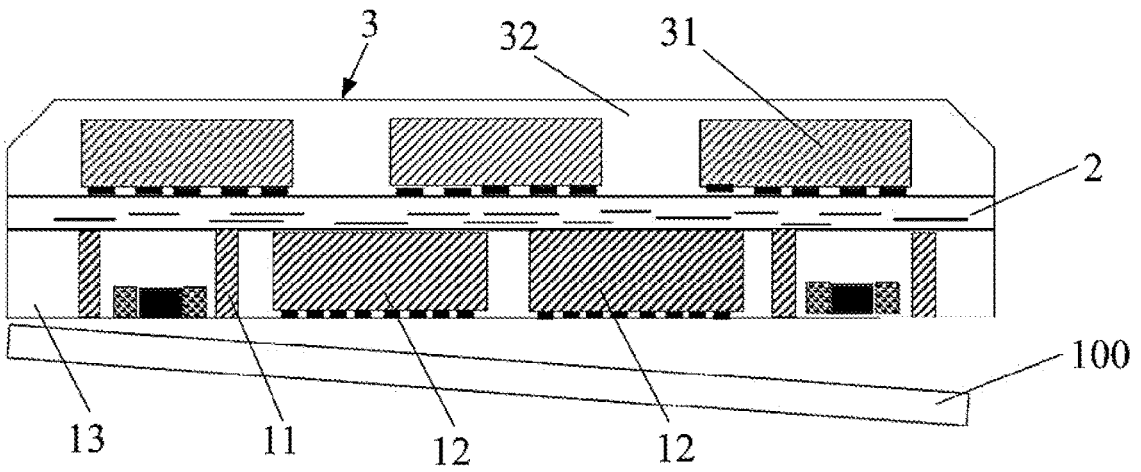
FIG. 11 is a schematic view showing a structure in which
a substrate is removed according to an embodiment of the
present invention.

In the step S5, the substrate 100 at the bottom of the first package 1 is removed, and after the second package 3 is obtained, the substrate 100 has the first package 1, the first redistribution layer 2, and the second package 3 arranged thereon sequentially in a direction away from the substrate 100. In the step S5, as shown in FIG. 11, the substrate 100 is separated from the first package 1, that is, the substrate 100 is temporarily unbonded from the first package 1. In some embodiments, the substrate 100 is removed by a laser or high temperature wet process.

After the substrate 100 is removed, the second redistribution layer 4 is formed on the surface of the first package 1 remote from the second package 3, that is, the second redistribution layer 4 is formed on the substrate surface of the first package 1. For a method for manufacturing the second redistribution layer 4, reference may be made to the method for manufacturing the first redistribution layer 2, and details are not described in this embodiment.

Figure 12:
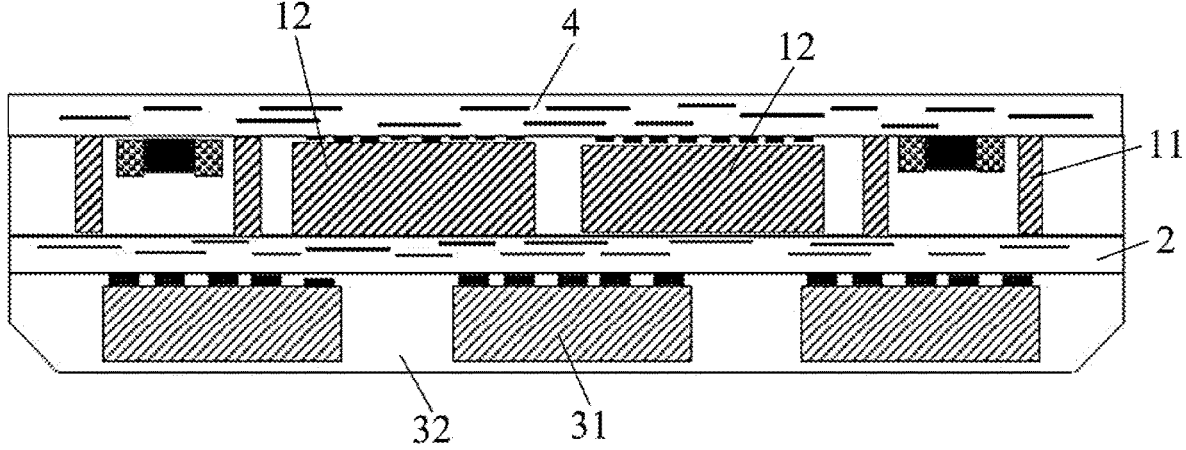
FIG. 12 is a schematic view showing a structure after a
second redistribution layer is formed according to an
embodiment of the present invention.

Since the first metal posts 11 and the bump of the first chip 12 are in direct contact with the substrate 100, after the second redistribution layer 4 is formed, the first metal posts 11 and the first chip 12 are each in contact with and electrically connected to the second redistribution layer 4, as shown in FIG. 12, so that two ends of each of the first metal posts 11 are electrically connected to the first redistribution layer 2 and the second redistribution layer 4, respectively, thereby realizing connection and signal transmission of the first redistribution layer 2 and the second redistribution layer 4. In this embodiment, the thickness of each of the first metal posts 11 is equal to the thickness of the first chip 12, so that the provision of the first metal posts 11 does not additionally increase the thickness of the first package 1, and the connection between the chips and the connection between the chip and the metal layer can be realized.

In the step S6, the second metal posts 51 and a flip-mounted third chip are formed at intervals on a surface of the second redistribution layer 4 remote from the first package 1, and the third chip 52 and the second metal posts 51 are mold packaged to obtain a third package 5, and the third chip 52 and the second metal posts 51 are each electrically connected to the second redistribution layer 4.

It is to be noted that, when the first package 1 includes the passive element groups 7, all the passive elements 71 are in contact with and are each electrically connected to the second redistribution layer 4.

Optionally, the step S6 may include the following steps: S61, S62, S63 and S64.

In the step S61, the second metal posts 51 are formed on the surface of the second redistribution layer 4 remote from the first package 1 by electroplating, where the second metal posts 51 are each electrically connected to the second redistribution layer 4.

Figure 13:
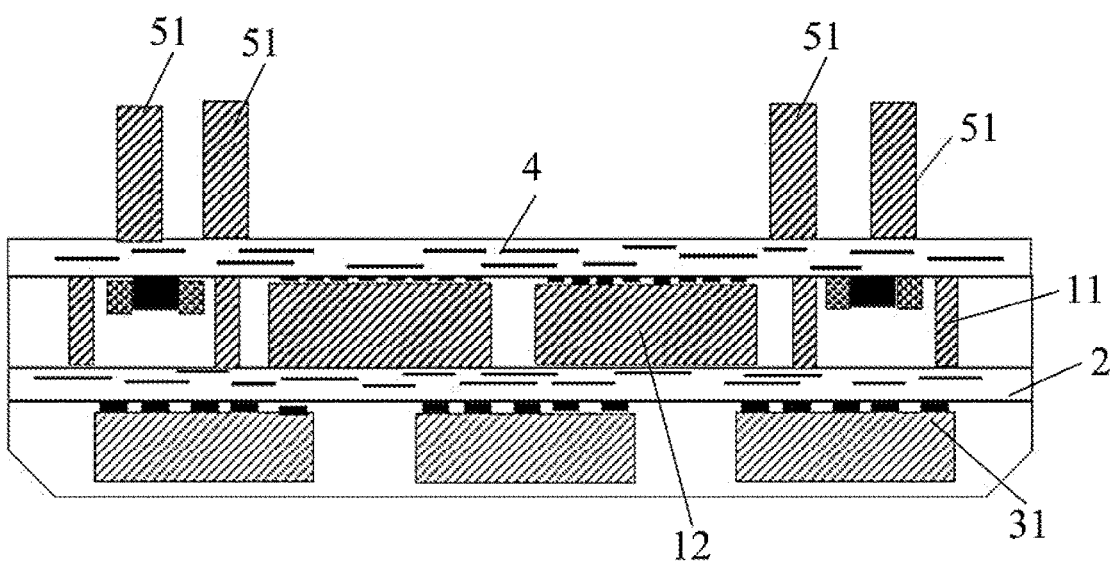
FIG. 13 is a schematic view showing a structure after
second metal posts are formed according to an embodiment
of the present invention.

In the step S61, the second metal posts 51 and the first metal posts 11 are arranged on an upper side and a lower side of the second redistribution layer 4, respectively. FIG. 13 shows a structure after the second metal posts 51 are formed. The second metal posts 51 are formed in the same manner as the first metal posts 11, which is not described in detail in this embodiment. Multiple second metal posts 51 are provided at intervals.

In the S62, the third chip 52 is flip-mounted on the surface of the second redistribution layer 4 remote from the first package 1, and the third chip 52 is electrically connected to the second redistribution layer 4.

Figure 14:
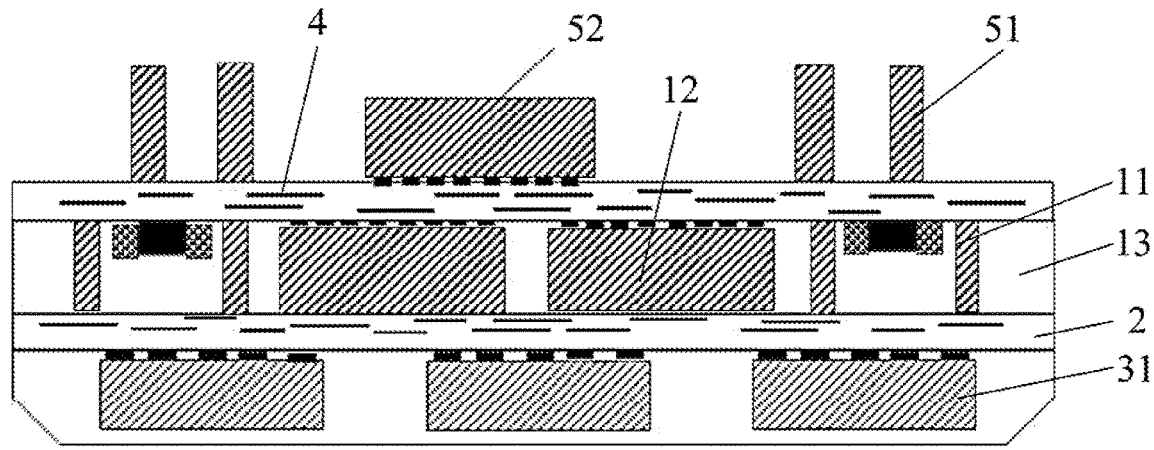
FIG. 14 is a schematic view showing a structure after
second chips are formed according to an embodiment of the
present invention.

In the step S62, a third chip 52 is arranged on the surface of the second redistribution layer 4 where the second metal posts 51 are arranged, and the bump of the third chip 52 faces the second redistribution layer 4 so that signals of the third chip 52 can be transmitted through the second redistribution layer 4 and the second metal posts 51. One or more third chips 52 are provided, which is not limited in this embodiment. FIG. 14 is a schematic view showing a structure after the third chips 52 are arranged on the second redistribution layer 4.

In the step S63, the second metal posts 51 and the third chip 52 are mold packaged through a molding process to obtain a second temporary molded package 300.

Figure 15:
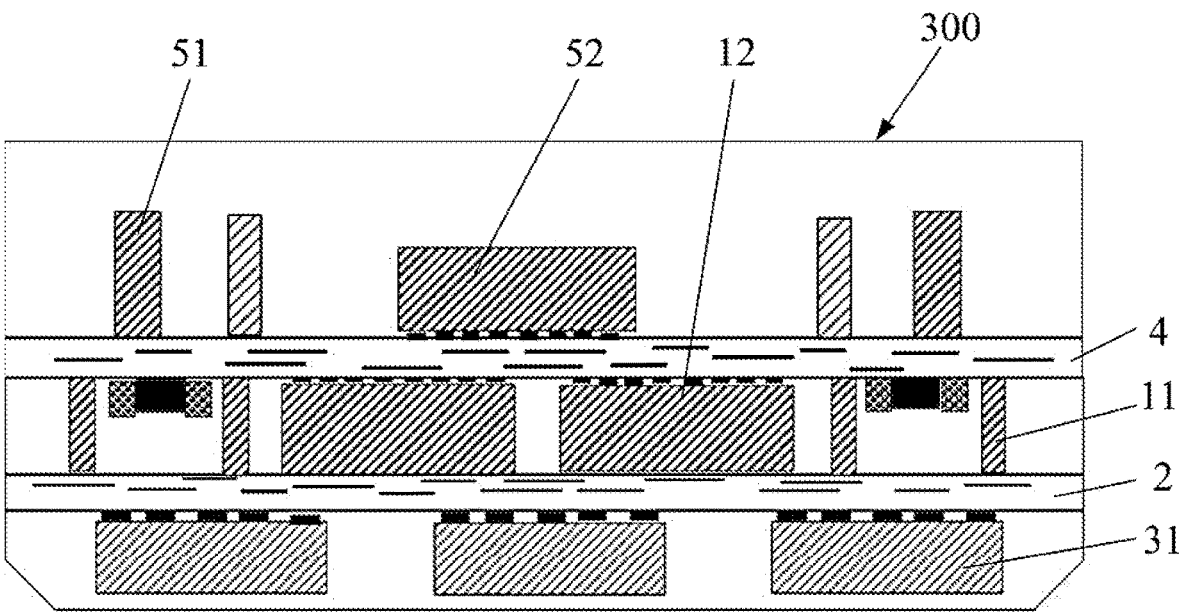
FIG. 15 is a schematic view showing a structure after a
second temporary molded package is formed according to an
embodiment of the present invention.

In the step S63, the second metal posts 51 and the third chip 52 are mold packaged through a molding process, and a colloid for embedding the second metal posts 51 and the third chip 52 is obtained. As shown in FIG. 15, the height of the colloid is larger than the height of each of the second metal posts 51 and the height of the third chip 52. In this embodiment, the third package 5 includes a third molded package 53 in which the second metal posts 51 and the third chip 52 are embedded.

In the step S64, the second temporary molded package 300 is ground to expose a back surface of the third chip 52 and the second metal posts 51, and the third package 5 is obtained.

Figure 16:
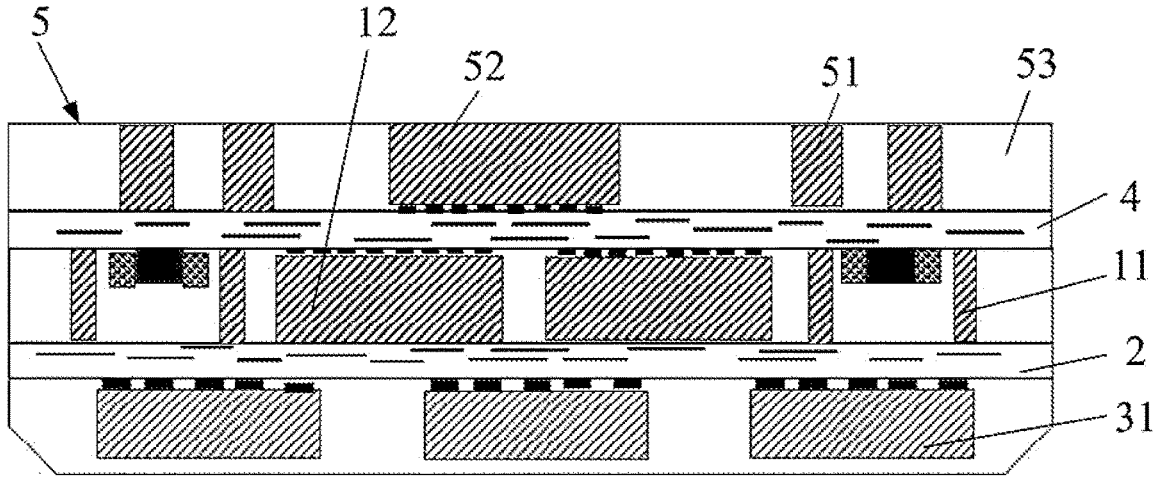
FIG. 16 is a schematic view showing a structure after a
third package is formed according to an embodiment of the
present invention.

The second temporary molded package 300 is processed in a manner similar to the processing of the first temporary molded package 200, and the back surface of the third chip 52 and the second metal posts 51 are exposed to obtain the third package 5 as shown in FIG. 16. The thickness of the third chip 52 is equal to the height of each of the second metal posts 51. In this embodiment, the third package 5 includes the second metal posts 51, the third chip 52, and the third molded package 53.

In the step S7, solder balls 6 are formed on a surface of the third package 5 remote from the first package 1 to obtain a wafer, and the solder balls 6 are electrically connected to the second redistribution layer 4 through the second metal posts 51, respectively.

Figure 18:
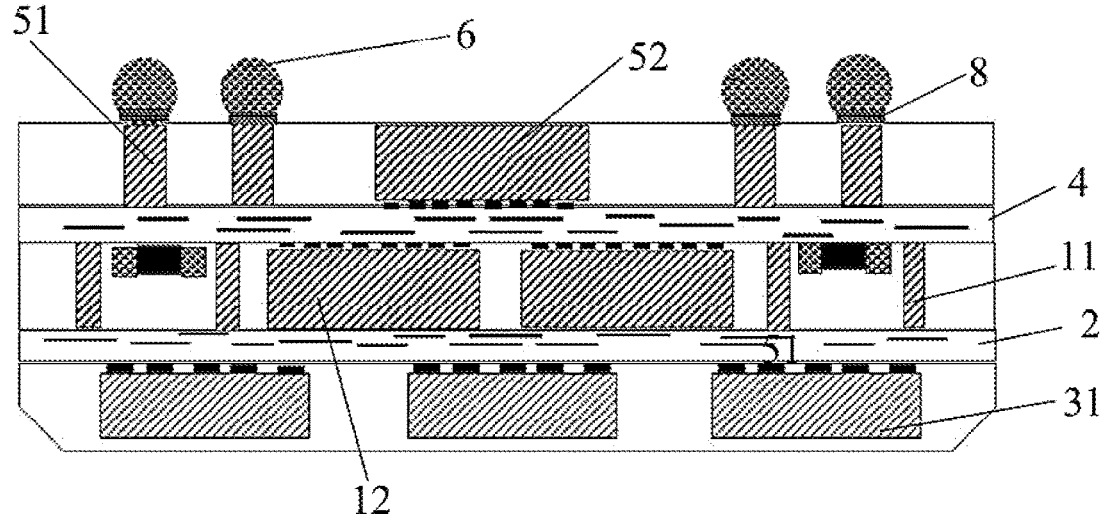
FIG. 18 is a schematic view showing a structure after
solder balls are formed according to an embodiment of the
present invention.

In this embodiment, the electrical signals of the multi-chip packaging structure are transmitted through the solder balls 6. The electrical signals of the first chip 12 are transmitted to the solder balls 6 through the second redistribution layer 4 and the second metal posts 51. The electrical signals of the second chip 31 are transmitted to the solder balls 6 through the first redistribution layer 2, the first metal posts 11, the second redistribution layer 4 and the second metal posts 51. The electrical signals of the third chip 52 are transmitted to the solder balls 6 through the second redistribution layer 4 and the second metal posts 51. The wafer in this embodiment is shown in FIG. 18.

According to the multi-chip packaging method of this embodiment, electrical signals of the first chip 12 are transmitted to the solder balls 6 through the second redistribution layer 4 and the second metal posts 51, electrical signals of the second chip 31 are transmitted to the solder balls 6 through the first redistribution layer 2, the first metal posts 11, the second redistribution layer 4 and the second metal posts 51, and electrical signals of the third chip 52 are transmitted to the solder balls 6 through the second redistribution layer 4 and the second metal posts 51, and a short-distance electrical signal connection between the chips and the transmission out of the electrical signals of the chips are realized through the first redistribution layer 2 and the second redistribution layer 4, so that a manufacturing process of the TSV is not required, thereby, the manufacturing difficulty and costs are low.

Moreover, in this embodiment, the density of the chip is high, and compared with the conventional technology, the thickness of the package is reduced, and the thermal performance of the multi-chip packaging structure of the three-dimensional structure is improved.

Optionally, the step S7 includes the following steps S71 and S72.

In the step S71, an under-ball pad layer 8 is formed on the surface of the third package 5 remote from the first package 1 by a photolithographic process.

Figure 17:
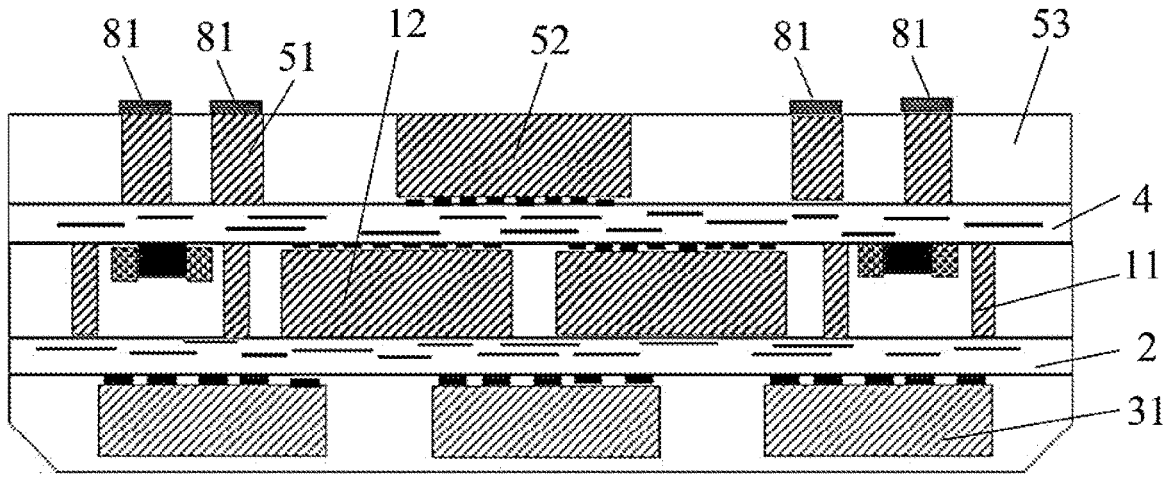
FIG. 17 is a schematic view showing a structure after an
under-ball pad layer is formed according to an embodiment
of the present invention.

In the step S71, the under-ball pad layer 8 is formed on the third package 5. In this embodiment, as shown in FIG. 17, the under-ball pad layer 8 includes multiple under-ball pads 81, which are in one-to-one correspondence with the multiple second metal posts 51, and each of the under-ball pads 81 is in contact with and electrically connected to a corresponding second metal post 51. Optionally, the under-ball pad layer 8 may be manufactured by a photolithographic process including the steps of coating a photoresist, exposing, developing, etching, electroforming (or electroplating), etc., for details, reference may be made to the conventional technology.

In the step S72, the solder balls 6 are formed on the under-ball pad layer 8 by electroplating or ball planting.

Figure 19:
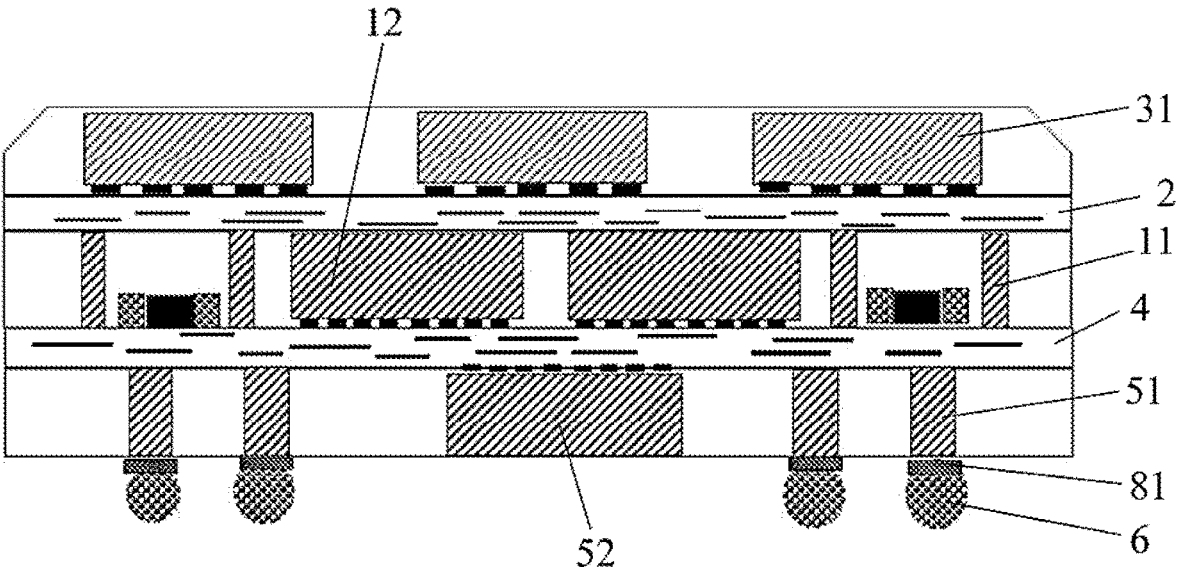
FIG. 19 is a schematic view showing a structure before an
interposer is soldered according to an embodiment of the
present invention.

In the step S72, the solder balls 6 are formed on the surface of the under-ball pad layer 8 remote from the third package 5 to obtain a structure as shown in FIG. 18 or FIG. 19. Multiple solder balls 6 are provided, the multiple solder balls 6 are in one-to-one correspondence with the multiple under-ball pads 81, and each of the solder balls 6 is in contact with and electrically connected to a corresponding under-ball pad 81. Optionally, the solder ball 6 is a microbump or a suction ball, which is not limited in this embodiment.

Optionally, as shown in FIG. 1, after the step S7, the multi-chip packaging method further includes the following steps: S8 and S9.

In the step S8, the wafer is divided into multiple monomers by cutting, each of the monomers includes at least one first chip 12, second chip 31, or third chip 52, and each of the monomers includes at least two solder balls 6.

In the S9, the solder balls 6 of the monomers are soldered to an interposer 9 to obtain a multi-chip package.

In the step S9, all the solder balls 6 of each of the monomers are each soldered to the interposer 9, to obtain a multi-chip package as shown in FIG. 2. As shown in FIG. 2, the interposer 9 includes an interposer board 91 and multiple interposer bumps 92, the multiple solder balls 6 are each soldered to an upper surface of the interposer board 91, the multiple interposer bumps 92 are provided on a lower surface of the interposer board 91, and the number of the interposer bumps 92 is larger than the number of the solder balls 6.

Second Embodiment

A multi-chip packaging structure is provided according to this embodiment, which is manufactured by the above-described multi-chip packaging method and has a small thickness and a high thermal performance.

As shown in FIG. 2, the multi-chip packaging structure includes a second package 3, a first redistribution layer 2, a first package 1, a second redistribution layer 4, and a third package 5, which are sequentially arranged from top to bottom.

The first package 1 includes first metal posts 11, a first chip 12, and a first molded package 13. Two ends of each of the first metal posts 11 are electrically connected to the first redistribution layer 2 and the second redistribution layer 4, respectively. The second package 3 includes a second chip 31 and a second molded package 32, and the second chip 31 is electrically connected to the first redistribution layer 2. The third package 5 includes second metal posts 51, a third chip 52, and a third molded package 53. One end of each of the second metal posts 51 is electrically connected to the second redistribution layer 4. The first chip 12 and the third chip 52 are each electrically connected to the second redistribution layer 4. Electrical signals of the first chip 12, the second chip 31, and the third chip 52 are respectively transmitted out through the second metal posts 51.

According to the multi-chip packaging structure of this embodiment, electrical signals of the first chip 12 are transmitted to the solder balls 6 through the second redistribution layer 4 and the second metal posts 51, electrical signals of the second chip 31 are transmitted to the solder balls 6 through the first redistribution layer 2, the first metal posts 11, the second redistribution layer 4 and the second metal posts 51, and electrical signals of the third chip 52 are transmitted to the solder balls 6 through the second redistribution layer 4 and the second metal posts 51, and a short-distance electrical signal connection between the chips and the transmission out of the electrical signals of the chips are realized through the first redistribution layer 2 and the second redistribution layer 4, so that a manufacturing process of the TSV is not required in the process of manufacturing, thereby, the manufacturing difficulty and costs are low.

Optionally, in this embodiment, the first package 1 further includes multiple passive element groups 7, each of the passive element groups 7 includes at least one passive element 71, and the passive element 71 is a capacitance, resistance or inductance. In this embodiment, each of the passive elements 71 is electrically connected to the second redistribution layer 4 to enable the passive element 71 to operate normally.

Optionally, in this embodiment, the multi-chip packaging structure further includes multiple under-ball pads 81 and multiple solder balls 6 in one-to-one correspondence. The multiple under-ball pads 81 form an under-ball pad layer 8. Multiple second metal posts 51 are provided, the multiple under-ball pads 81 are in one-to-one correspondence with the multiple second metal posts 51, each of the under-ball pads 81 is electrically connected to another end of a corresponding second metal post 51, and each of the solder balls 6 is soldered to a corresponding under-ball pad 81.

In this embodiment, as shown in FIG. 2, the multi-chip packaging structure further includes an interposer 9. The interposer 9 includes an interposer board 91 and multiple interposer bumps 92, the multiple solder balls 6 are each soldered to an upper surface of the interposer board 91, and the multiple interposer bumps 92 are fixedly provided on a lower surface of the interposer board 91, and the number of the interposer bumps 92 is larger than the number of the solder balls 6, so that the transfer points are encrypted. In this embodiment, each of the interposer bumps 92 has a spherical shape. The interposer board 91 may be a PCB board.

What is claimed is:

1. A multi-chip packaging method, comprising:

flip-mounting a first chip on a substrate on which a first metal post is fixedly arranged, wherein the first metal post and the first chip are arranged on a same surface of the substrate at an interval;

mold packaging the first metal post and the first chip through a molding process to obtain a first package arranged on the substrate, wherein the first package comprises the first metal post, the first chip and a first molded package;

forming a first redistribution layer on a surface of the first package remote from the substrate, wherein the first metal post is electrically connected to the first redistribution layer;

flip-mounting a second chip on a surface of the first redistribution layer remote from the substrate, and mold packaging the second chip to obtain a second package arranged on the first redistribution layer, wherein the second package comprises the second chip and a second molded package, the second chip is electrically connected to the first redistribution layer, and the first redistribution layer is arranged between the first chip and the second chip;

removing the substrate, and forming a second redistribution layer on a surface of the first package remote from the second package, wherein the first chip and the first metal post are each electrically connected to the second redistribution layer;

forming second metal posts spaced apart from each other and flip-mounting a third chip on a surface of the second redistribution layer remote from the first package, and mold packaging the third chip and the second metal posts to obtain a third package, wherein the third chip and the second metal posts are each electrically connected to the second redistribution layer; and forming solder balls on a surface of the third package remote from the first package to obtain a wafer, wherein each of the solder balls is electrically connected to the second redistribution layer through a corresponding one of the second metal posts.

2. The multi-chip packaging method according to claim 1, wherein the first package further comprises a passive element group, the multi-chip packaging method further comprises, before mold packaging the first metal post and the first chip through the molding process to obtain the first package arranged on the substrate, mounting the passive element group to the substrate, wherein in mold packaging the first metal post and the first chip through the molding process to obtain the first package arranged on the substrate, the first metal post, the first chip and the passive element group are mold packaged through the molding process.

3. The multi-chip packaging method according to claim 1, wherein mold packaging the first metal post and the first chip through the molding process to obtain the first package arranged on the substrate comprises:

mold packaging the first metal post and the first chip through the molding process to obtain a first temporary molded package; and grinding the first temporary molded package to expose a back surface of the first chip and the first metal post, and obtaining the first package.

4. The multi-chip packaging method according to claim 1, wherein forming the second metal posts spaced apart from each other and flip-mounting the third chip on the surface of the second redistribution layer remote from the first package, and mold packaging the third chip and the second metal posts to obtain the third package comprises:

forming the second metal posts on a surface of the second redistribution layer remote from the first package by electroplating, wherein the second metal posts are electrically connected to the second redistribution layer;

flip-mounting the third chip on a surface of the second redistribution layer remote from the first package, wherein the third chip is electrically connected to the second redistribution layer;

mold packaging the second metal posts and the third chip through a molding process to obtain a second temporary molded package; and grinding the second temporary molded package to expose a back surface of the third chip and the second metal posts to obtain the third package.

5. The multi-chip packaging method according to claim 1, wherein forming the solder balls on the surface of the third package remote from the first package to obtain the wafer comprises:

forming an under-ball pad layer on the surface of the third package remote from the first package by a photolithographic process; and forming the solder balls by electroplating or ball planting on the under-ball pad layer.

6. The multi-chip packaging method according to claim 1, wherein after forming the solder balls on the surface of the third package remote from the first package to obtain the wafer, the multi-chip packaging method further comprises:

dividing the wafer into a plurality of monomers by cutting; and soldering the solder balls of the monomers to an interposer to obtain a multi-chip package.

\* \* \* \* \*